US006482657B2

(12) United States Patent
Shimazawa

(10) Patent No.: US 6,482,657 B2
(45) Date of Patent: Nov. 19, 2002

(54) METHODS OF MANUFACTURING TUNNEL MAGNETORESISTIVE ELEMENT, THIN-FILM MAGNETIC HEAD AND MEMORY ELEMENT

(75) Inventor: Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 19 days.

(21) Appl. No.: 09/749,563

(22) Filed: Dec. 28, 2000

(65) Prior Publication Data

US 2001/0021537 A1 Sep. 13, 2001

(30) Foreign Application Priority Data

Jan. 18, 2000 (JP) ........................................ 2000-008642

(51) Int. Cl.⁷ .............................................. H01L 21/00
(52) U.S. Cl. ......................... 438/3; 438/421; 438/431; 257/31
(58) Field of Search ........................ 438/3, 431, 421; 257/31

(56) References Cited

U.S. PATENT DOCUMENTS

| | | | | |
|---|---|---|---|---|
| 5,764,567 A | | 6/1998 | Parkin ........................ | 365/173 |
| 5,835,314 A | * | 11/1998 | Moodera et al. ............ | 257/421 |
| 5,948,553 A | * | 9/1999 | Kamijo .................... | 204/192.2 |
| 6,344,954 B1 | | 3/2000 | Redon et al. | |
| 6,048,739 A | * | 4/2000 | Hurst et al. .................... | 438/3 |
| 6,335,081 B1 | | 7/2000 | Araki et al. | |
| 6,219,274 B1 | | 4/2001 | Shimazawa et al. ........ | 365/158 |
| 6,339,330 B1 | * | 1/2002 | Sato et al. ................... | 324/252 |

FOREIGN PATENT DOCUMENTS

| | | |
|---|---|---|
| JP | A 6-168892 | 6/1994 |
| JP | A-10-190090 | 7/1998 |
| JP | A-2000-11333 | 1/2000 |

OTHER PUBLICATIONS

U.S. patent application Ser. No. 09/517,455, Redon et al., filed Mar. 2, 2000.

U.S. patent application Ser. No. 09/517,570, Redon et al., filed Mar. 2, 2000.

U.S. patent application Ser. No. 09/538,470, Araki et al., filed Mar. 30, 2000.

U.S. patent application Ser. No. 09/542,907, Shimazawa et al., filed Apr. 4, 2000.

U.S. patent application Ser. No. 09/542,996, Shimazawa et al., filed Apr. 4, 2000.

U.S. patent application Ser. No. 09/612,310, Shimazawa et al., filed Jul. 7, 2000.

Moodera et al., "Large Magnetoresistive at Room Temperature in Ferromagnetic Thin Film Tunnel Junctions," Physical Review Letters, vol. 74, No. 16, pp. 3273–3276, Apr. 17, 1995.

Moodera et al., "Ferromagnetic–insulator–ferromagnetic Tunneling: Spin–dependent tunneling and large magnetoresistance in Trilayer Junctions (Invited)," J. Appl. Phys. 79 (8), pp. 4724–4729, Apr. 15, 1996.

* cited by examiner

Primary Examiner—Long Pham
Assistant Examiner—William David Coleman
(74) Attorney, Agent, or Firm—Oliff & Berridge PLC

(57) ABSTRACT

A TMR element includes: a free layer formed on a lower gap layer; a tunnel barrier layer formed on the free layer; and a pinned layer formed on the tunnel barrier layer. In the step of forming the tunnel barrier layer on the free layer, an Al layer used for making the tunnel barrier layer is formed through sputtering, for example, on the free layer while the substrate is cooled. The Al layer is oxidized to form the tunnel barrier layer.

12 Claims, 15 Drawing Sheets

| tunnel barrier layer thickness [nm] | TMR element resistance [Ω] | resistance change rate [%] |
|---:|---:|---:|
| 0.4 | 3.1 | 0.6 |
| 0.5 | 3.2 | 0.6 |
| 0.6 | 3.2 | 0.5 |
| 0.7 | 45.2 | 24.1 |
| 0.8 | 81.3 | 23.5 |
| 0.9 | 147.9 | 22.7 |
| 1.0 | 269.9 | 22.3 |

FIG. 16

| tunnel barrier layer thickness [nm] | TMR element resistance [Ω] | resistance change rate [%] |
|---:|---:|---:|
| 0.4 | 3.2 | 0.5 |
| 0.5 | 3.1 | 0.7 |
| 0.6 | 22.8 | 24.7 |
| 0.7 | 42.1 | 24.3 |
| 0.8 | 74.6 | 24.1 |
| 0.9 | 137.7 | 23.5 |
| 1.0 | 243.8 | 22.2 |

FIG. 17

| tunnel barrier layer thickness [nm] | TMR element resistance [Ω] | resistance change rate [%] |
|---:|---:|---:|
| 0.4 | 3.1 | 0.7 |
| 0.5 | 8.9 | 25.3 |
| 0.6 | 21.1 | 24.6 |
| 0.7 | 40.8 | 24.5 |
| 0.8 | 69.1 | 23.8 |
| 0.9 | 132.3 | 23.5 |
| 1.0 | 238.2 | 21.3 |

FIG. 18

| tunnel barrier layer thickness [nm] | TMR element resistance [Ω] | resistance change rate [%] |
|---:|---:|---:|
| 0.4 | 3.1 | 0.6 |
| 0.5 | 3.3 | 0.7 |
| 0.6 | 3.2 | 0.5 |
| 0.7 | 3.2 | 0.6 |
| 0.8 | 3.2 | 0.5 |
| 0.9 | 83.9 | 21.6 |
| 1.0 | 191.6 | 21.8 |

FIG. 19

| tunnel barrier layer thickness [nm] | TMR element resistance [Ω] | resistance change rate [%] |
|---:|---:|---:|
| 0.4 | 3.1 | 0.6 |
| 0.5 | 3.3 | 0.7 |
| 0.6 | 3.2 | 0.5 |
| 0.7 | 3.2 | 0.7 |
| 0.8 | 39.6 | 19.8 |
| 0.9 | 80.6 | 22.8 |
| 1.0 | 183.2 | 22.0 |

FIG. 20

| tunnel barrier layer thickness [nm] | TMR element resistance [Ω] | resistance change rate [%] |
|---:|---:|---:|
| 0.4 | 3.3 | 0.5 |
| 0.5 | 3.2 | 0.7 |
| 0.6 | 18.7 | 21.5 |
| 0.7 | 33.7 | 22.6 |
| 0.8 | 60.6 | 22.4 |
| 0.9 | 93.8 | 22.2 |
| 1.0 | 208.6 | 21.9 |

FIG. 21

| substrate temperature | | insulating layer forming rate | base roughness | critical thickness | resistance of TMR element with critical thickness | resistance change rate with critical thickness | output | noise |
|---|---|---|---|---|---|---|---|---|
| insulating layer [°C] | layers other than insulating layer [°C] | [nm/s] | [nm] | [nm] | [Ω] | [%] | [μVpp] | [μVrms] |
| 100 | 100 | 0.03 | 0.21 | 0.9 | 63.2 | 21.3 | 1555 | 26.1 |
| 100 | 28 | 0.03 | 0.23 | 0.9 | 64.5 | 21.8 | 1570 | 26.2 |
| 100 | -196 | 0.03 | 0.21 | 0.9 | 70.1 | 22.3 | 1157 | 26.7 |
| 28 | 100 | 0.03 | 0.22 | 0.7 | 34.7 | 23.5 | 1692 | 23.0 |
| 28 | 28 | 0.03 | 0.19 | 0.6 | 22.8 | 24.7 | 1735 | 21.6 |
| 28 | -196 | 0.03 | 0.24 | 0.6 | 21.3 | 24.6 | 1294 | 21.8 |
| -196 | 100 | 0.03 | 0.21 | 0.6 | 23.1 | 24.9 | 1793 | 21.6 |
| -196 | 28 | 0.03 | 0.22 | 0.5 | 8.9 | 25.3 | 1822 | 19.7 |
| -196 | -196 | 0.03 | 0.22 | 0.5 | 9.5 | 25.5 | 1422 | 19.5 |
| 100 | 100 | 0.3 | 0.22 | 0.9 | 62.8 | 21.3 | 1534 | 25.9 |
| 100 | 28 | 0.3 | 0.21 | 0.9 | 66.3 | 22.1 | 1591 | 26.4 |
| 100 | -196 | 0.3 | 0.21 | 0.8 | 42.7 | 23.1 | 1214 | 23.9 |
| 28 | 100 | 0.3 | 0.19 | 0.8 | 43.1 | 23.6 | 1699 | 23.3 |
| 28 | 28 | 0.3 | 0.23 | 0.7 | 28.6 | 24.1 | 1735 | 22.2 |
| 28 | -196 | 0.3 | 0.22 | 0.7 | 29.5 | 24.5 | 1408 | 22.6 |
| -196 | 100 | 0.3 | 0.2 | 0.6 | 21.3 | 24.8 | 1738 | 21.1 |
| -196 | 28 | 0.3 | 0.21 | 0.6 | 19.6 | 25.1 | 1807 | 20.8 |
| -196 | -196 | 0.3 | 0.23 | 0.5 | 10.4 | 25.3 | 1456 | 19.7 |
| 100 | 100 | 0.03 | 1.62 | 1 | 98.3 | 16.7 | 1303 | 29.5 |
| 100 | 28 | 0.03 | 1.63 | 0.9 | 56.8 | 18.5 | 1332 | 25.6 |
| 100 | -196 | 0.03 | 1.61 | 0.9 | 58.3 | 19.0 | 988 | 25.5 |
| 28 | 100 | 0.03 | 1.58 | 0.8 | 37.2 | 19.4 | 1424 | 23.4 |
| 28 | 28 | 0.03 | 1.61 | 0.8 | 39.6 | 19.8 | 1460 | 23.7 |
| 28 | -196 | 0.03 | 1.65 | 0.8 | 40.2 | 19.7 | 1129 | 23.9 |
| -196 | 100 | 0.03 | 1.62 | 0.7 | 26.3 | 20.8 | 1484 | 21.7 |
| -196 | 28 | 0.03 | 1.65 | 0.6 | 18.7 | 21.5 | 1548 | 20.5 |
| -196 | -196 | 0.03 | 1.61 | 0.6 | 19.5 | 21.7 | 1181 | 21.1 |

FIG. 24

METHODS OF MANUFACTURING TUNNEL MAGNETORESISTIVE ELEMENT, THIN-FILM MAGNETIC HEAD AND MEMORY ELEMENT

BACKGROUND OF THE INVENTION

1. Field of the Invention

The present invention relates to a method of manufacturing a tunnel magnetoresistive element utilizing the tunnel magnetoresistive effect, a method of manufacturing a thin-film magnetic head incorporating the tunnel magnetoresistive element, and a method of manufacturing a memory element incorporating the tunnel magnetoresistive element.

2. Description of the Related Art

Performance improvements in thin-film magnetic heads have been sought as recording density of hard disk drives has increased. Such thin-film magnetic heads include composite thin-film magnetic heads that have been widely used. A composite head is made of a layered structure including a recording head having an induction-type electromagnetic transducer for writing and a reproducing head having a magnetoresistive element for reading.

Reproducing heads that exhibit high sensitivity and produce high outputs have been required. In response to such demands, attention has been focused on tunnel magnetoresistive elements (that may be hereinafter called TMR elements) that detect a magnetic field through the use of the tunnel magnetoresistive effect.

The TMR element has a structure in which a lower magnetic layer, a tunnel barrier layer and an upper magnetic layer are stacked. Each of the lower and upper magnetic layers include a ferromagnetic substance. In general, the magnetic layer closer to the substrate is called the lower magnetic layer and the magnetic layer farther from the substrate is called the upper magnetic layer. Therefore, the terms 'upper' and 'lower' of the upper and lower magnetic layers do not always correspond to the position in the arrangement of an actual TMR element.

The tunnel barrier layer is a layer made of a thin nonmagnetic insulating film through which electrons are capable of passing while maintaining spins thereof by means of the tunnel effect, that is, through which a tunnel current is allowed to pass. The tunnel magnetoresistive effect is a phenomenon that, when a current is fed to a pair of magnetic layers sandwiching the tunnel barrier layer, a tunnel current passing through the tunnel barrier layer changes, depending on the relative angle between magnetizations of the two magnetic layers. If the relative angle between magnetizations of the magnetic layers is small, the tunneling rate is high. As a result, the resistance to the current passing across the magnetic layers is reduced. If the relative angle between magnetizations of the magnetic layers is large, the tunneling rate is low. The resistance to the current passing across the magnetic layers is therefore increased.

A prior-art TMR element is formed by stacking the lower magnetic layer, the tunnel barrier layer and the upper magnetic layer in this order on the substrate. The tunnel barrier layer is formed by, for example, making a layer of a nonmagnetic substance, which is represented by aluminum (Al), on the lower magnetic layer, and oxidizing this layer through a method such as natural oxidation or plasma oxidation.

To apply a TMR element to the head of a hard disk drive, it is necessary to reduce the resistance of the TMR element in terms of not only performance characteristics but also mass-productivity. It is known that a reduction in thickness of the tunnel barrier layer achieves a reduction in resistance of the TMR element.

Reference is now made to FIG. 16 to describe an experiment performed to determine the relationship among the thickness of the tunnel barrier layer, the resistance of the TMR element, and the rate of change in the resistance of the TMR element. Elements having the following structure were used for this experiment. Each of the elements had a lower electrode layer made up of three layers of a Ta layer having a thickness of 5 nm, a Cu layer having a thickness of 50 nm, and a Ta layer having a thickness of 5 nm. On the lower electrode layer, the following layers were stacked one by one: a free layer made up of two layers of a NiFe layer having a thickness of 3 nm and a CoFe layer having a thickness of 3 nm; a tunnel barrier layer; a pinned layer made up of two layers of a CoFe layer having a thickness of 3 nm and a PtMn layer having a thickness of 17 nm; and an upper electrode layer made up of two layers of a Cu layer having a thickness of 50 nm and a Ta layer having a thickness of 5 nm. The tunnel barrier layer was formed by making an Al layer having a specific thickness through sputtering and oxidizing the Al layer in an oxygen atmosphere at 200 Torr (26664.4 Pa) for one hour. The area of the free layer, the tunnel barrier layer and the pinned layer joined to each other (hereinafter called the size of the TMR element) was 1 $\mu$m by 1 $\mu$m.

Immediately before the Al layer was formed, the center line average roughness Ra of the CoFe layer, which was the base layer of the Al layer, was 0.23 nm. The center line average roughness Ra indicates the flatness of the surface of the CoFe layer. Therefore, the CoFe layer surface was relatively flat. The Al layer was formed at a room temperature. It is estimated that the temperature of the substrate when the Al layer was formed was approximately 40 to 50° C., due to the energy exerted during sputtering.

FIG. 16 shows the relationship among the tunnel barrier layer thickness, the resistance of the TMR element, and the maximum rate of change in the resistance of the TMR element (simply shown as resistance change rate in the table) obtained from the experiment performed under the above-mentioned conditions. The resistance change rate was obtained from an amount of change in the resistance of the TMR element when an external magnetic field was changed, the amount of change being divided by a minimum resistance value and being indicated in percent.

As shown in FIG. 16, the resistance of the TMR element decreased while the maximum rate of change in the resistance increased, as the thickness of the tunnel barrier layer (Al layer) was reduced to 0.7 nm. The characteristics of the TMR element were thereby improved. However, if the tunnel barrier layer thickness was 0.6 nm or smaller, the maximum rate of change in the resistance was made too small and the characteristics of the TMR element were extremely reduced. This is because, if the Al layer to be the tunnel barrier layer was too thin, it was impossible that the Al layer had a continuous structure. As a result, a leakage current other than a tunnel current flew through the tunnel barrier layer. The minimum thickness of the Al layer capable of forming a continuous structure is hereinafter called a critical thickness. The critical thickness was 0.7 nm, according to the experiment result shown in FIG. 16.

To meet recording density of 40 gigabits per square inch or greater, it is expected that the size of a TMR element is required to be as small as or smaller than 0.4 $\mu$m by 0.4 $\mu$m.

According to the experiment result shown in FIG. 16, when the tunnel barrier layer thickness was 0.7 nm, the resistance of the TMR element of 1 μm by 1 μm was 30.4 ohm. Therefore, when the critical thickness is about 0.7 nm, the resistance of the TMR element is 100 ohm or greater, if the size of the TMR element is as small as or smaller than 0.4 μm by 0.4 μm. This resistance is not small enough, regarding the demand for obtaining low-resistance TMR elements.

OBJECT AND SUMMARY OF THE INVENTION

It is an object of the invention to provide methods of manufacturing a tunnel magnetoresistive element, a thin-film magnetic head and a memory element, for reducing the thickness of a tunnel barrier layer without reducing performance characteristics.

A method of the invention is provided for manufacturing a tunnel magnetoresistive element comprising a tunnel barrier layer and first and second magnetic layers sandwiching the tunnel barrier layer. The method includes the steps of: forming the first magnetic layer on a substrate; forming the tunnel barrier layer on the first magnetic layer; forming the second magnetic layer on the tunnel barrier layer; and cooling the substrate prior to or at the same time as the step of forming the tunnel barrier layer. The step of forming the tunnel barrier layer includes the step of forming a layer of a material used for making the tunnel barrier layer on the first magnetic layer while the substrate remains cooled.

A method of the invention is provided for manufacturing a thin-film magnetic head incorporating a tunnel magnetoresistive element comprising a tunnel barrier layer and first and second magnetic layers sandwiching the tunnel barrier layer. The method includes the above-described steps.

A method of the invention is provided for manufacturing a memory element incorporating a tunnel magnetoresistive element comprising a tunnel barrier layer and first and second magnetic layers sandwiching the tunnel barrier layer. The method includes the above-described steps.

According to the methods of manufacturing the tunnel magnetoresistive element, the thin-film magnetic head or the memory element of the invention, the layer of the material used for making the tunnel barrier layer is formed on the first magnetic layer while the substrate remains cooled. As a result, the layer thus made easily forms a continuous structure. It is thereby possible to further reduce the thickness of the tunnel barrier layer.

According to the methods of manufacturing the tunnel magnetoresistive element, the thin-film magnetic head or the memory element of the invention, the step of forming the tunnel barrier layer may include the steps of: forming a layer of a nonmagnetic metal material, which is the material used for making the tunnel barrier layer, on the first magnetic layer while the substrate remains cooled; and oxidizing the layer of the nonmagnetic metal material to form the tunnel barrier layer.

According to the methods of manufacturing the tunnel magnetoresistive element, the thin-film magnetic head or the memory element of the invention, the substrate may be cooled only in the step of forming the tunnel barrier layer, among the steps of forming the first magnetic layer, forming the tunnel barrier layer, and forming the second magnetic layer.

According to the methods of manufacturing the tunnel magnetoresistive element, the thin-film magnetic head or the memory element of the invention, the step of forming the first magnetic layer may include flattening of a surface to be a base of the tunnel barrier layer.

According to the methods of manufacturing the tunnel magnetoresistive element, the thin-film magnetic head or the memory element of the invention, in the step of forming the layer of the material used for making the tunnel barrier layer, this layer may be formed at a rate lower than a rate at which the other layers are formed in the steps of forming the other layers.

Other and further objects, features and advantages of the invention will appear more fully from the following description.

BRIEF DESCRIPTION OF THE DRAWINGS

FIG. 16 is a table showing the relationship between the tunnel barrier layer thickness and the characteristics of the TMR element obtained through an experiment.

FIG. 17 is a table showing the relationship between the tunnel barrier layer thickness and the characteristics of the TMR element obtained through an experiment.

FIG. 18 is a table showing the relationship between the tunnel barrier layer thickness and the characteristics of the TMR element obtained through an experiment.

FIG. 19 is a table showing the relationship between the tunnel barrier layer thickness and the characteristics of the TMR element obtained through an experiment.

FIG. 20 is a table showing the relationship between the tunnel barrier layer thickness and the characteristics of the TMR element obtained through an experiment.

FIG. 21 is a table showing the relationship between the tunnel barrier layer thickness and the characteristics of the TMR element obtained through an experiment.

FIG. 24 shows the result of experiment performed to determine the relationship between the conditions and so on for making the tunnel barrier layer of the prototype head and the characteristics of the TMR element.

DETAILED DESCRIPTION OF THE PREFERRED EMBODIMENTS

Preferred embodiments of the invention will now be described in detail with reference to the accompanying drawings.

[First Embodiment]

Figure 1:
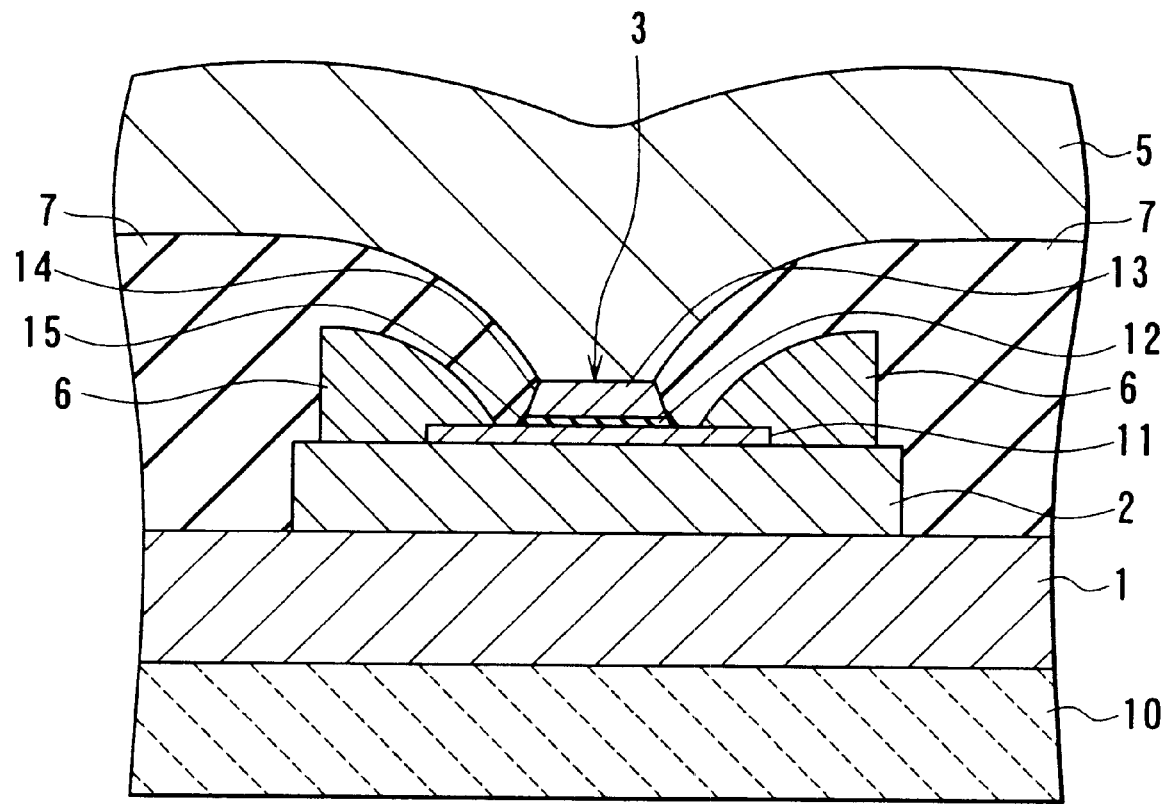
FIG. 1 is a cross section illustrating an example of the configuration of a thin-film magnetic head of a first embodiment of the invention.
Figure 2:
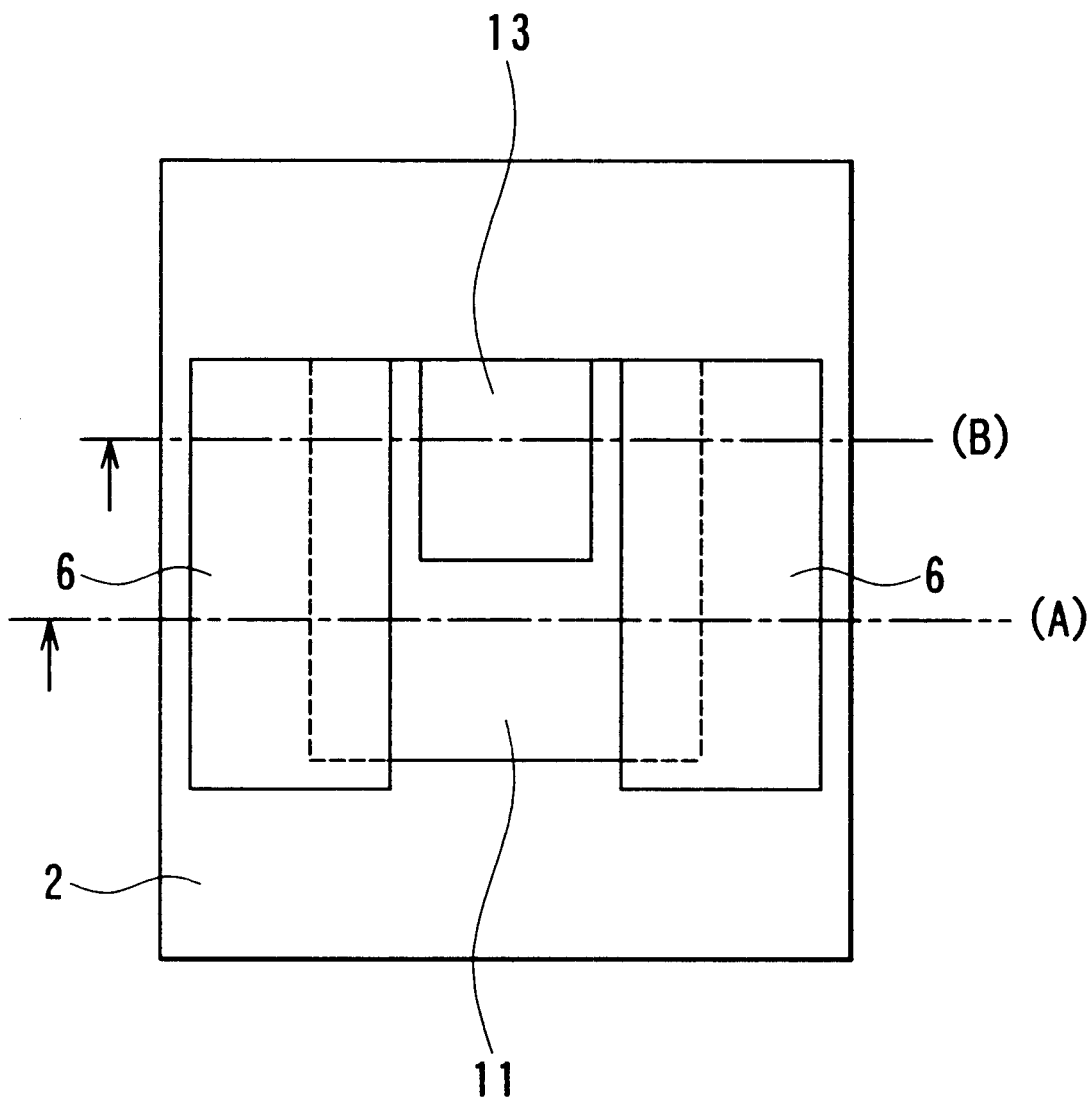
FIG. 2 is a top view of the thin-film magnetic head shown in FIG. 1.

Reference is now made to FIG. 1 and FIG. 2 to describe an example in which configurations of a tunnel magnetoresistive element and a thin-film magnetic head are shown. A method of manufacturing a tunnel magnetoresistive element and a method of manufacturing a thin-film magnetic head of a first embodiment of the invention are applied to the tunnel magnetoresistive element and the thin-film magnetic head. FIG. 1 is a cross section illustrating the configuration of the thin-film magnetic head of this example. FIG. 2 is a top view of the head shown in FIG. 1. FIG. 1 is the cross section parallel to a medium facing surface that faces toward a recording medium. FIG. 2 illustrates the state before the medium facing surface is formed. According to the head of this example, the structure shown in FIG. 2 is polished from the bottom part of FIG. 2 to the level indicated with alternate short and long dash line (A) or (B) to form the medium facing surface.

The thin-film magnetic head of this example functions as a reproducing (read) head that reproduces data magnetically recorded on a recording medium. The thin-film magnetic head comprises: a lower-electrode-cum-lower-shield layer (hereinafter called a lower shield layer) 1 formed on a substrate 10; a lower gap layer 2 formed on the lower shield layer 1; a tunnel magnetoresistive element (hereinafter called a TMR element) 3 of this example formed on the lower gap layer 2; and an upper-electrode-cum-upper-shield layer (hereinafter called an upper shield layer) 5 formed on the TMR element 3. The lower gap layer 2 is made of a nonmagnetic and conductive material, and has functions of preventing leakage of magnetism toward the lower shield layer 1, adjusting the distance between the lower shield layer 1 and the upper shield layer 5, adjusting the position of the TMR element 3, and maintaining the uniformity of tunnel current.

The TMR element 3 includes: a free layer 11, which functions as a first magnetic layer, formed on the lower gap layer 2; a tunnel barrier layer 12 formed on the free layer 11; and a pinned layer 13, which functions as a second magnetic layer, formed on the tunnel barrier layer 12. In this example the tunnel barrier layer 12 and the pinned layer 13 extend over an area smaller than the area of the free layer 11. The free layer 11 contains a ferromagnetic substance and has a direction of magnetization that changes in response to an external magnetic field. The tunnel barrier layer 12 is a layer made of a thin nonmagnetic insulating film through which electrons are capable of passing while maintaining spins thereof by means of the tunnel effect, that is, through which a tunnel current is allowed to pass. The pinned layer 13 contains a ferromagnetic substance and is pinned such that the direction of magnetization is kept constant regardless of an external field.

The thin-film magnetic head of this example further comprises: a pair of hard magnet layers 6 placed on sides of the TMR element 3 on the lower gap layer 2; and an insulating layer 7 that covers the lower shield layer 1, the lower gap layer 2, the hard magnet layers 6 and the free layer 11. The hard magnet layers 6 are provided for applying a bias magnetic field to the TMR element 3 in the horizontal direction of FIG. 1.

The pinned layer 13 and the tunnel barrier layer 12 of the TMR element 3 have sidewalls 14 formed through etching. The TMR element 3 further comprises a deposition layer 15 made of a substance which is separated from the pinned layer 13 and the tunnel barrier layer 12 through etching and deposits on the sidewalls 14 and undergoes oxidation or nitriding.

Each of the lower shield layer 1 and the upper shield layer 5 is made of at least one layer containing any of NiFe (Permalloy), Sendust, CoFe, and CoFeNi, for example. Each of the lower shield layer 1 and the upper shield layer 5 has a thickness of 0.5 to 4 $\mu$m, or preferably 1 to 3 $\mu$m, for example.

The lower gap layer 2 is made of at least one layer containing any of Cu, Al, Au, Ta, Rh, Cr, In, Ir, Mg, Ru, Ti, W and Zn, for example. The lower gap layer 2 has a thickness of 5 to 70 nm, or preferably 10 to 50 nm, or more preferably 10 to 30 nm, for example.

The free layer 11 is made of at least one layer containing any of Fe, Co, Ni, CoFe, NiFe, CoZrNb and CoFeNi, for example. The free layer 11 has a thickness of 2 to 50 nm, or preferably 4 to 30 nm.

The tunnel barrier layer 12 is made of any of $Al_2O_8$, NiO, GdO, MgO, $Ta_2O_5$, $MoO_2$, $TiO_2$, and $WO_2$, for example. The tunnel barrier layer 12 has a thickness of 0.5 to 2 nm, for example.

The pinned layer 13 is made of at least one layer including any of Fe, Co, Ni, CoFe, NiFe, CoZrNb and CoFeNi, for example. The pinned layer 13 has a thickness of 1 to 10 nm, or preferably 2 to 5 nm. The pinned layer 13 may include a pinning layer for pinning magnetization. This pinning layer is made of an antiferromagnetic material such as PtMn and has a thickness of 6 to 30 nm, for example.

The hard magnet layers 6 are made of a material having high coercive force such as CoPt. The insulating layer 7 is made of an insulating material such as $Al_2O_3$.

The deposition layer 15 is made of a substance which is separated from the pinned layer 13 and the tunnel barrier layer 12 through etching of the layers 13 and 12 and deposits on the sidewalls 14 and undergoes oxidation or nitriding. Therefore, the deposition layer 15 is mainly made of an oxide or a nitride of the material forming the pinned layer 13.

Figure 3:
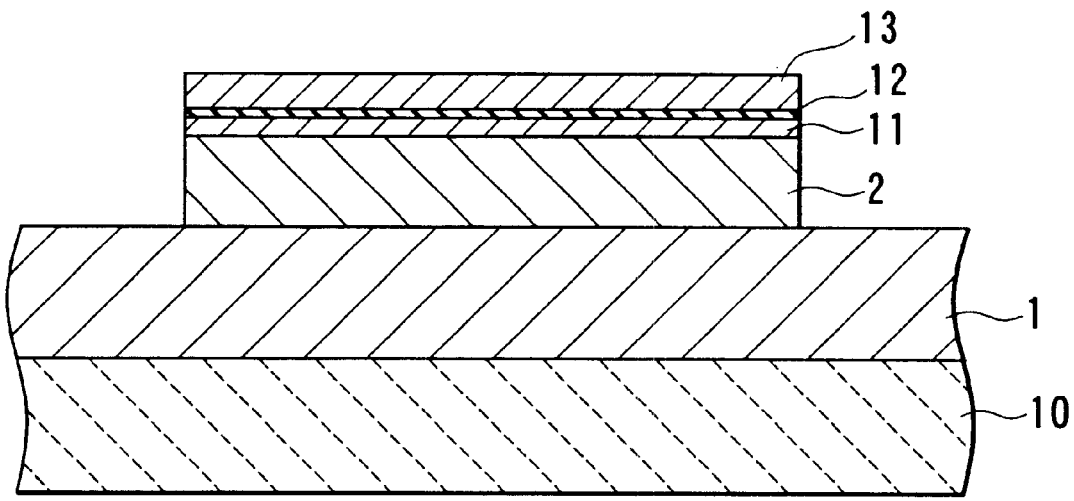
FIG. 3 is a cross section for illustrating a step in a method of manufacturing the thin-film magnetic head shown in FIG. 1.

Reference is now made to FIG. 3 to FIG. 8 to describe the method of manufacturing the thin-film magnetic head shown in FIG. 1. In the manufacturing method, as shown in FIG. 3, the lower shield layer 1 is formed through plating, for example, on the substrate 10. Next, the lower gap layer 2, the free layer 11, the tunnel barrier layer 12 and the pinned layer 13 are formed in this order through sputtering, for example, on the lower shield layer 1.

Figure 4:
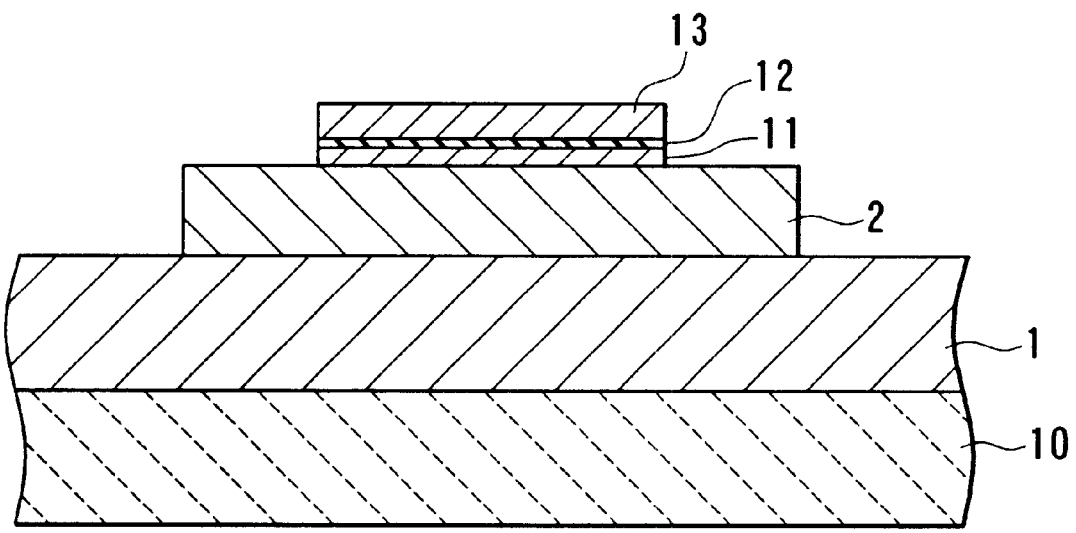
FIG. 4 is a cross section for illustrating a step that follows FIG. 3.

Next, as shown in FIG. 4, the free layer 11, the tunnel barrier layer 12 and the pinned layer 13 are selectively etched through ion milling, for example, to pattern these layers into desired shapes. Alternatively, the free layer 11, the tunnel barrier layer 12 and the pinned layer 13 may be formed into desired shapes through the liftoff method.

Figure 5:
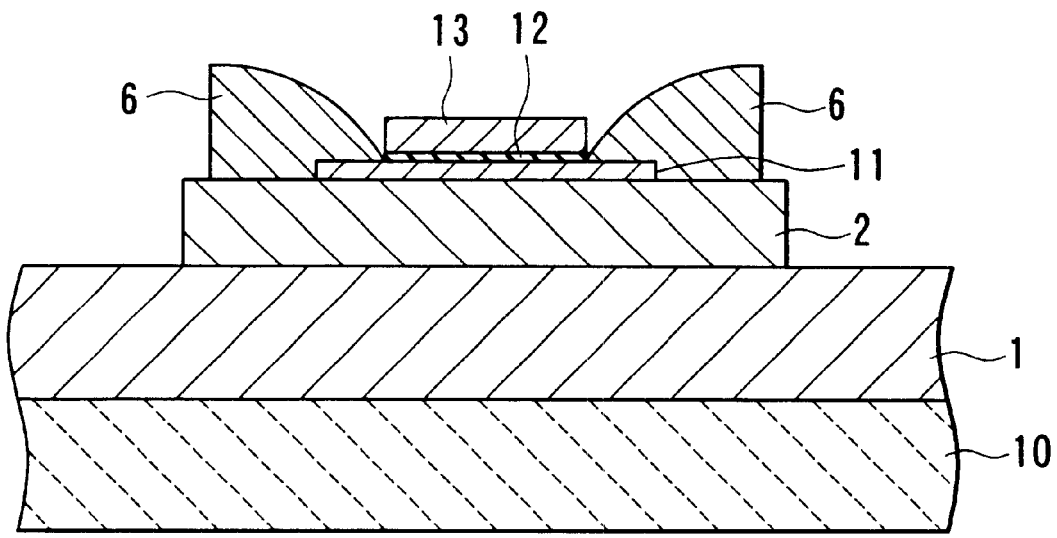
FIG. 5 is a cross section for illustrating a step that follows FIG. 4.

Next, as shown in FIG. 5, the tunnel barrier layer 12 and the pinned layer 13 are selectively etched through ion milling, for example, to expose portions of the free layer 11 near ends thereof. Next, a pair of hard magnet layers 6 are formed through sputtering, for example, to extend from the top of the portions of the free layer 11 exposed to top of the lower gap layer 2.

Figure 6:
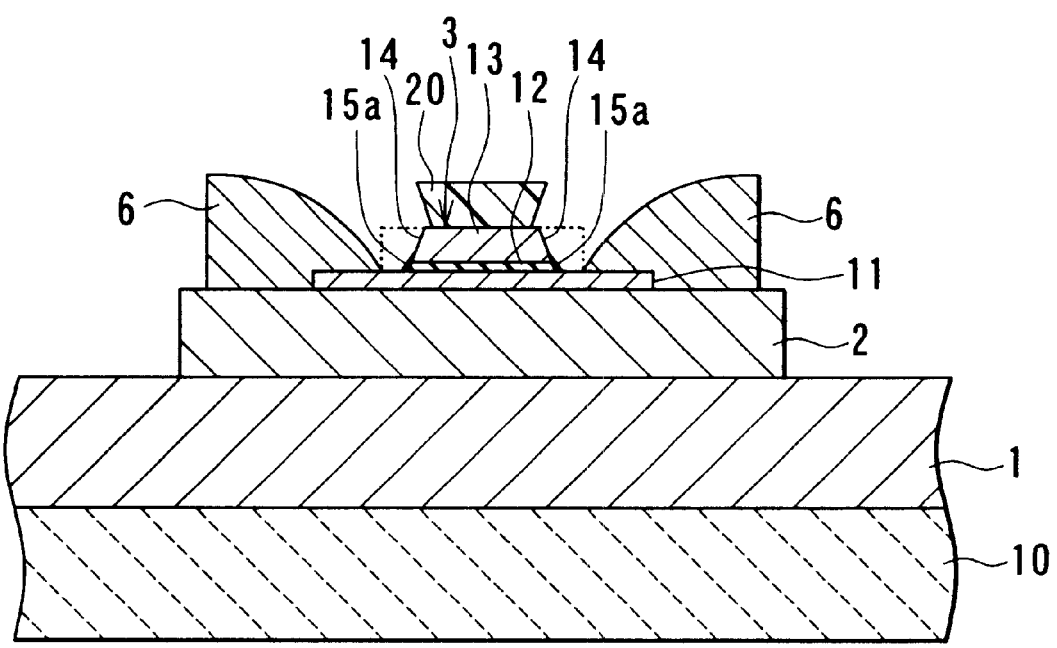
FIG. 6 is a cross section for illustrating a step that follows FIG. 5.

Next, as shown in FIG. 6, a resist mask 20 is formed on the pinned layer 13. The resist mask 20 has a top surface which is smaller than the top surface of the pinned layer 13 in area. Next, the pinned layer 13 and the tunnel barrier layer 12 are selectively etched through ion milling, for example, using the mask 20. Through this etching, the TMR element 3 having a specific shape and made of the free layer 11, the tunnel barrier layer 12 and the pinned layer 13 is formed, and the sidewalls 14 of the pinned layer 13 and the tunnel barrier layer 12 are formed. In addition, the substance separated through etching deposits on the sidewalls 14 and forms deposition layers 15a. The deposition layers 15a are mainly made of the material forming the pinned layer 13 such as Co or CoFe and have conductivity.

Figure 7:
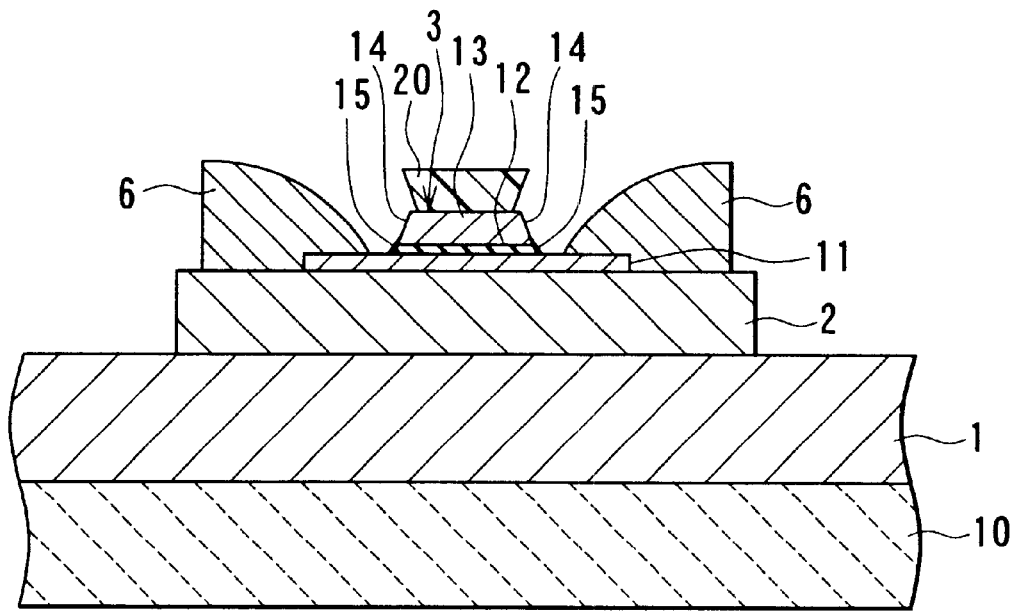
FIG. 7 is a cross section for illustrating a step that follows FIG. 6.

Next, as shown in FIG. 7, oxidation or nitriding of the deposition layers 15a is performed to increase the resistance value of the deposition layers 15a. Through this oxidation, the deposition layers 15a are made deposition layers 15 of high resistance.

Figure 8:
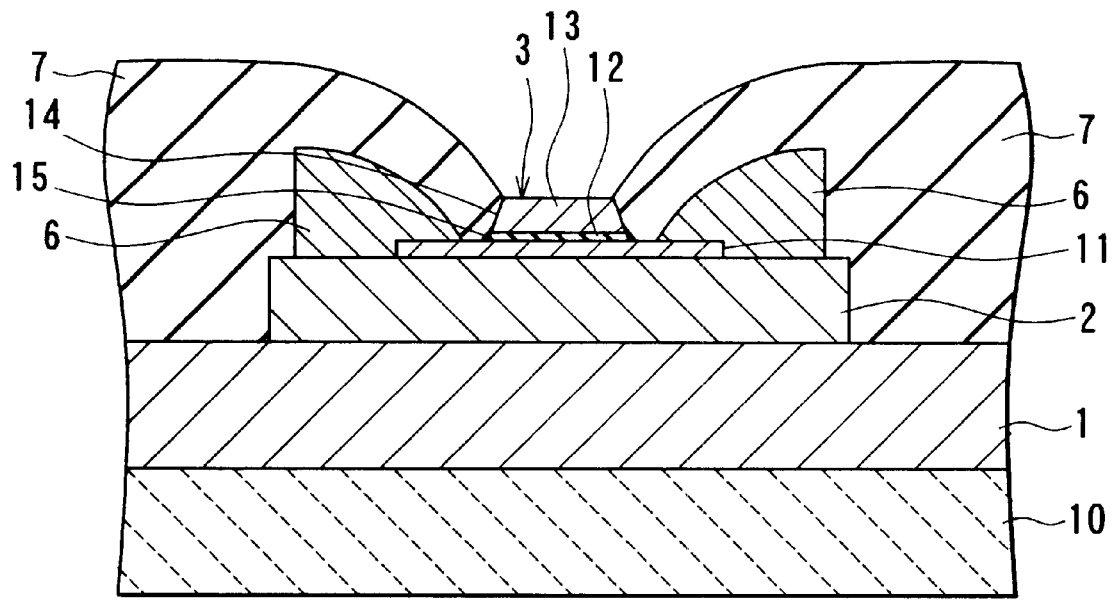
FIG. 8 is a cross section for illustrating a step that follows FIG. 7.

Next, as shown in FIG. 8, the insulating layer 7 is formed through sputtering, for example, to cover the lower shield layer 1, the lower gap layer 2, the hard magnet layers 6, the free layer 11 and the sidewalls 14. The resist mask 20 is then removed.

Next, as shown in FIG. 1, the upper shield layer 5 is formed through plating, for example, on the pinned layer 13 and the insulating layer 7. The thin-film magnetic head is thus completed.

Figure 9:
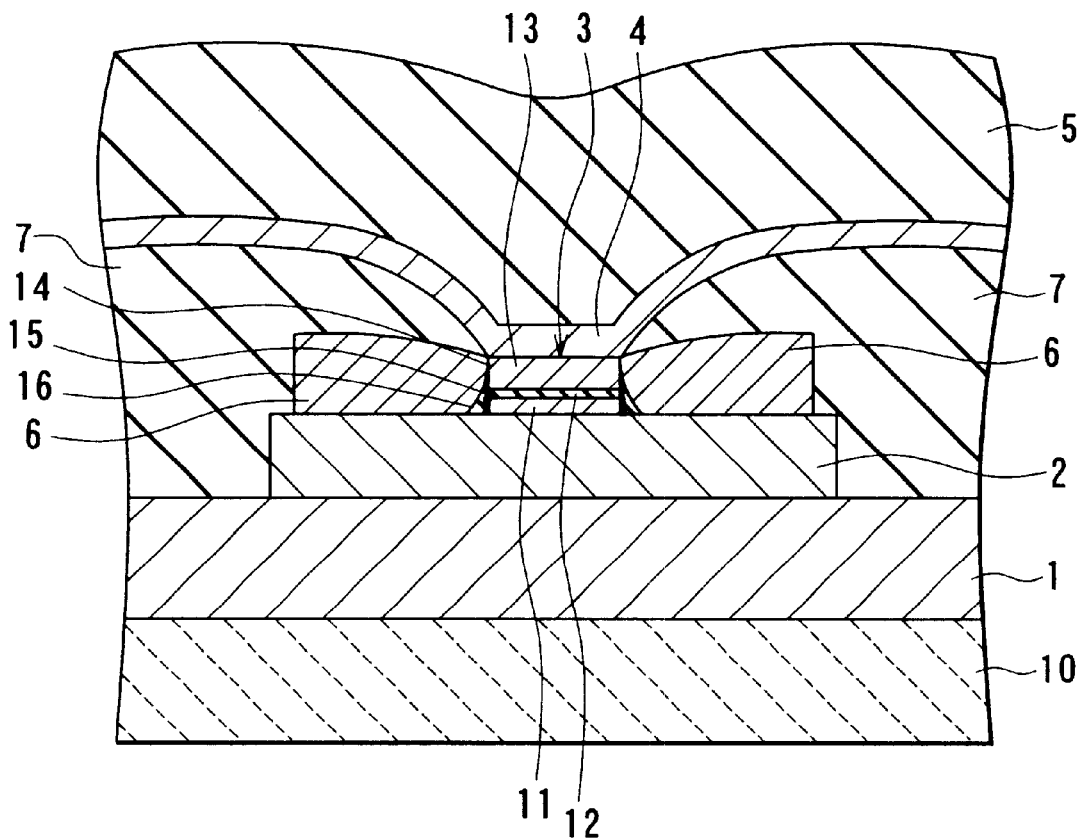
FIG. 9 is a cross section illustrating another example of the configuration of the thin-film magnetic head of the first embodiment of the invention.

Reference is now made to FIG. 9 to describe another example of configurations of the TMR element and thin-film magnetic head of the first embodiment of the invention. FIG. 9 is a cross section illustrating the configuration of the thin-film magnetic head of this example.

The thin-film magnetic head of this example comprises: the lower shield layer 1 formed on the substrate 10; the lower gap layer 2 formed on the lower shield layer 1; the TMR element 3 of this example formed on the lower gap layer 2; an upper gap layer 4 formed on the TMR element 3; and the upper shield layer 5 formed on the upper gap layer 4. The upper gap layer 4 is made of a nonmagnetic and conductive material. The upper gap layer 4 has functions of preventing leakage of magnetism toward the upper shield layer 5, adjusting the distance between the lower shield layer 1 and the upper shield layer 5, adjusting the position of the TMR element 3, and maintaining the uniformity of tunnel current.

The TMR element 3 includes: the free layer 11, which functions as the first magnetic layer, formed on the lower gap layer 2; the tunnel barrier layer 12 formed on the free layer 11; and the pinned layer 13, which functions as the second magnetic layer, formed on the tunnel barrier layer 12. In this example the free layer 11, the tunnel barrier layer 12 and the pinned layer 13 have plane geometries nearly similar to one another.

The thin-film magnetic head of this example further comprises: a pair of hard magnet layers 6 placed on the sides of the TMR element 3 on the lower gap layer 2; and the insulating layer 7 that covers the lower shield layer 1, the lower gap layer 2 and the hard magnet layers 6.

The pinned layer 13, the tunnel barrier layer 12 and the free layer 11 of the TMR element 3 have the sidewalls 14 formed through etching. The TMR element 3 further comprises: the deposition layers 15 made of a substance which is separated through etching and deposits on the sidewalls 14 and undergoes oxidation; and an insulating layer 16 that covers the sidewalls 14 and the deposition layers 15.

The upper gap layer 4 is made of at least one layer containing any of Cu, Al, Au, Ta, Rh, Cr, In, Ir, Mg, Ru, Ti, W and Zn, for example. The upper gap layer 4 has a thickness of 5 to 70 nm, or preferably 10 to 50 nm, or more preferably 10 to 30 nm, for example. The insulating layer 16 is made of an insulating material such as $Al_2O_3$.

The remainder of configuration of the thin-film magnetic head shown in FIG. 9 is similar to that of the head shown in FIG. 1.

Figure 10:
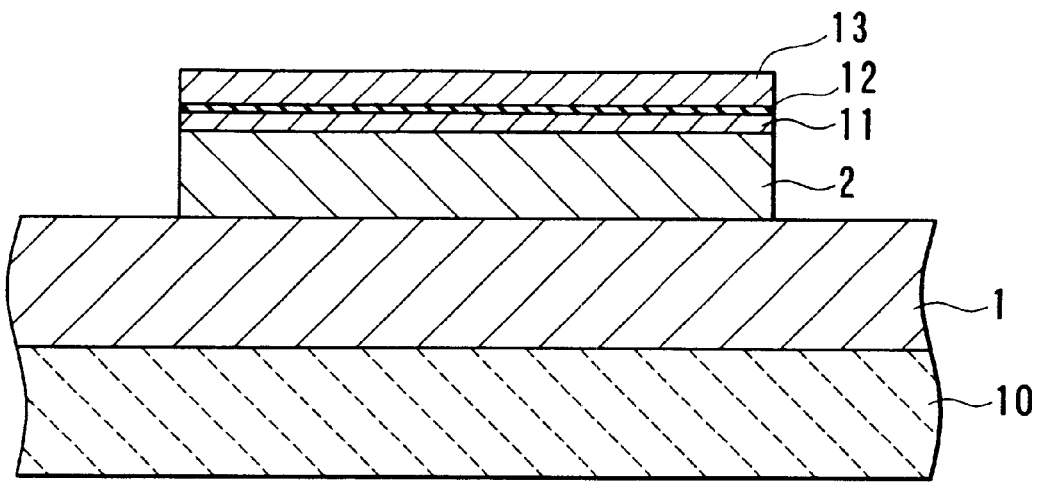
FIG. 10 is a cross section for illustrating a step in a method of manufacturing the thin-film magnetic head shown in FIG. 9.

Reference is now made to FIG. 10 to FIG. 14 to describe the method of manufacturing the thin-film magnetic head shown in FIG. 9. In the manufacturing method, as shown in FIG. 10, the lower shield layer 1 is formed through plating, for example, on the substrate 10. Next, the lower gap layer 2, the free layer 11, the tunnel barrier layer 12 and the pinned layer 13 are formed in this order through sputtering, for example, on the lower shield layer 1. Alternatively, the liftoff method may be employed to form the free layer 11, the tunnel barrier layer 12 and the pinned layer 13 into specific shapes.

Figure 11:
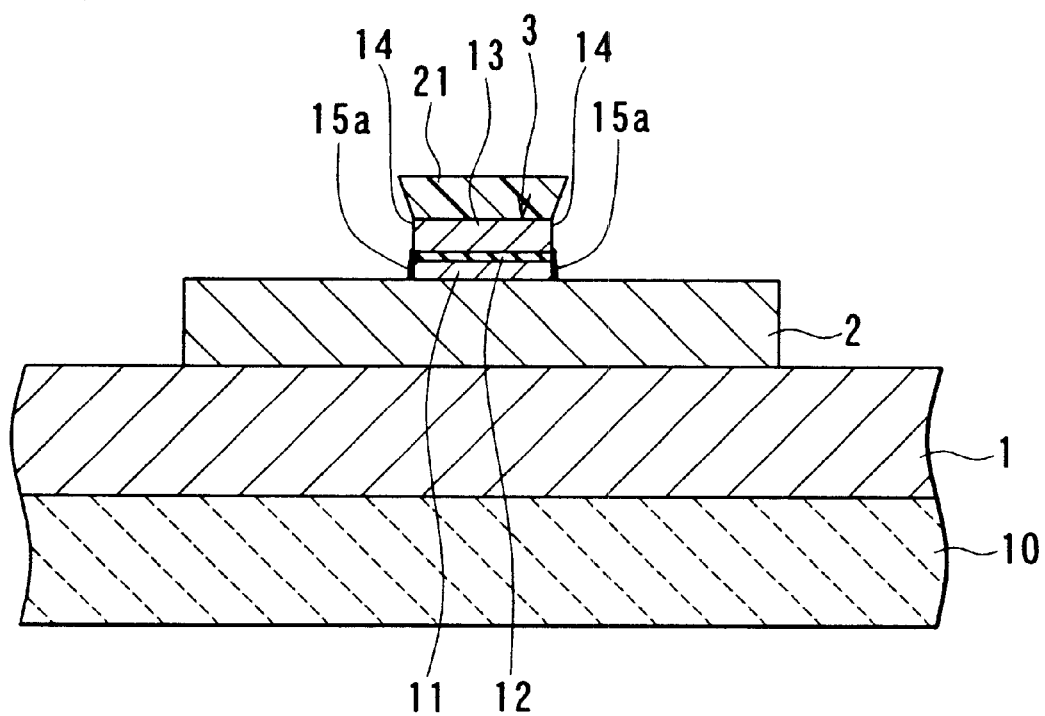
FIG. 11 is a cross section for illustrating a step that follows FIG. 10.

Next, as shown in FIG. 11, the resist mask 21 having a specific shape is formed on the pinned layer 13. The pinned layer 13, the tunnel barrier layer 12 and the free layer 11 are selectively etched through ion milling, for example, using the resist mask 21. At the same time, the lower gap layer 2 is also etched to some extent. Through this etching, the TMR element 3 having a specific shape and made of the free layer 11, the tunnel barrier layer 12 and the pinned layer 13 is formed, and the sidewalls 14 of the pinned layer 13, the tunnel barrier layer 12 and the free layer 11 are formed. In addition, the substance separated through etching deposits on the sidewalls 14 and forms the deposition layers 15a. The deposition layers 15a are mainly made of the material forming the lower gap layer 2 such as Ta, Al or Rh and have conductivity.

Figure 12:
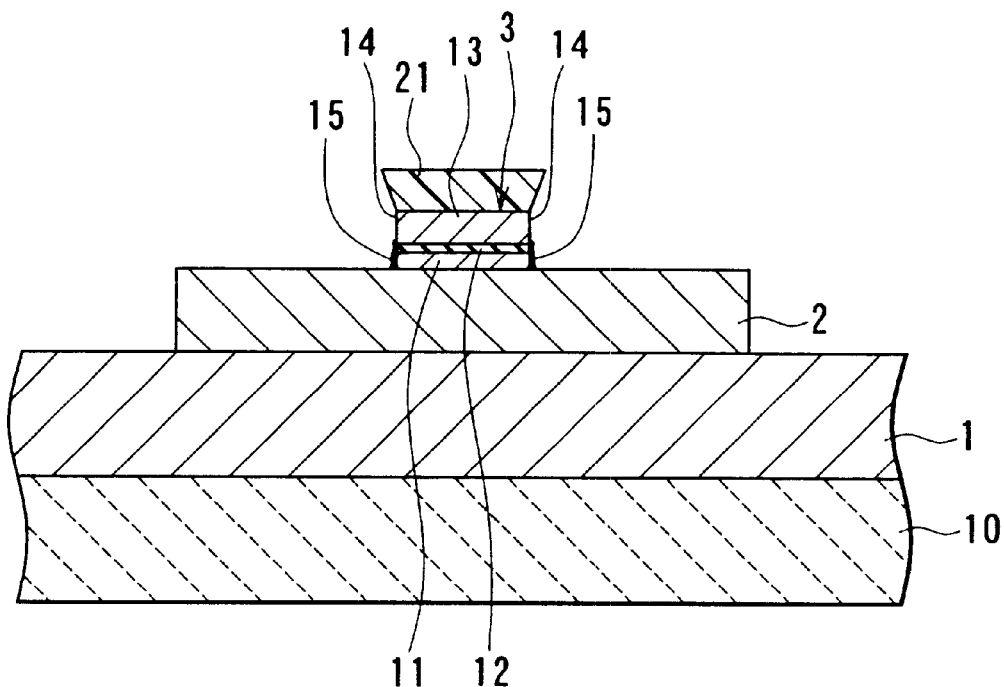
FIG. 12 is a cross section for illustrating a step that follows FIG. 11.

Next, as shown in FIG. 12, oxidation or nitriding of the deposition layers 15a is performed to increase the resistance value of the deposition layers 15a. Through this oxidation or nitriding, the deposition layers 15a are made deposition layers 15 of high resistance.

Figure 13:
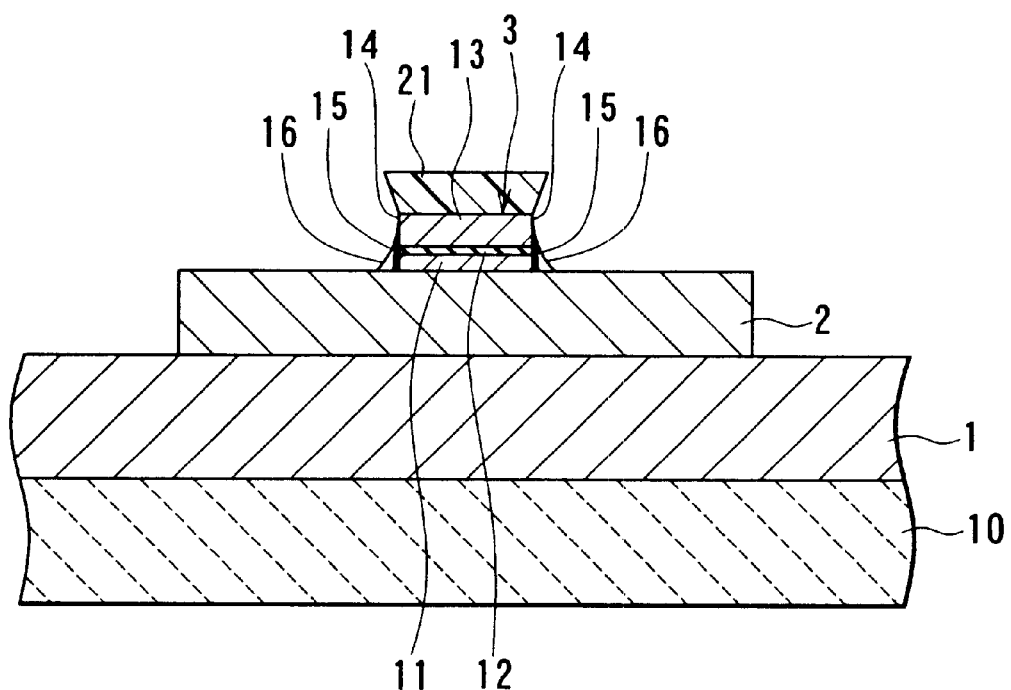
FIG. 13 is a cross section for illustrating a step that follows FIG. 12.

Next, as shown in FIG. 13, a thin insulating layer 16 is formed through sputtering, for example, to cover the sidewalls 14 and the deposition layers 15.

Figure 14:
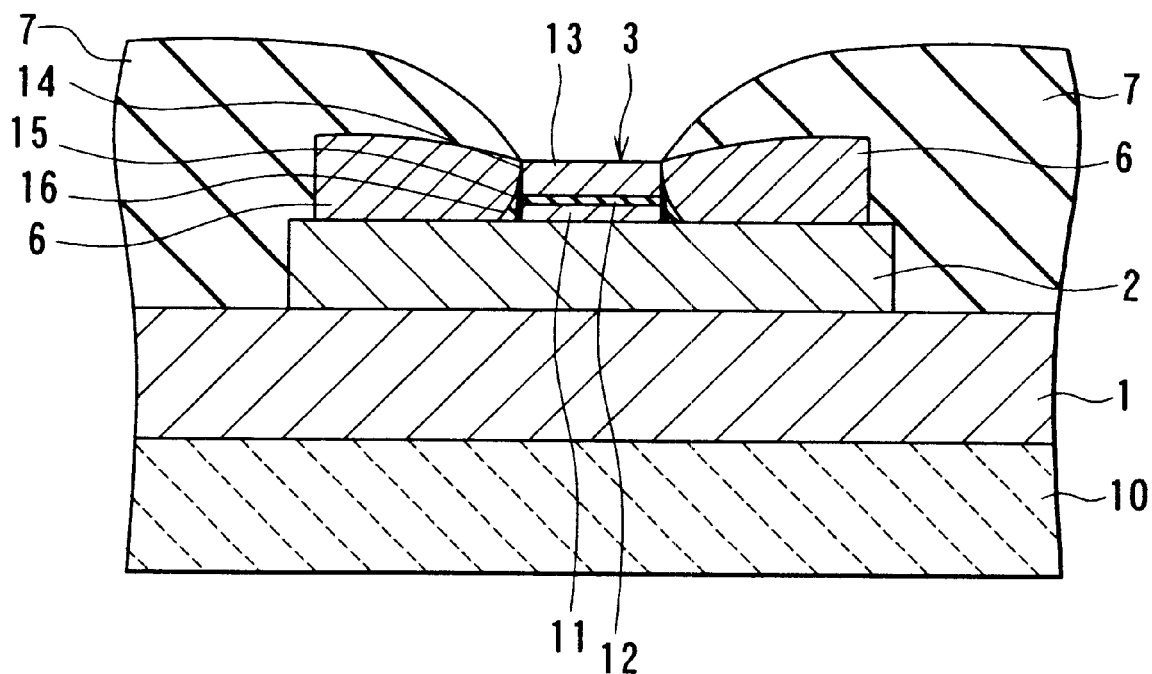
FIG. 14 is a cross section for illustrating a step that follows FIG. 13.

Next, as shown in FIG. 14, the hard magnet layers 6 are formed through sputtering, for example, on the lower gap layer 2. The insulating layer 7 is then formed through sputtering, for example, to cover the lower shield layer 1, the lower gap layer 2, and the hard magnet layers 6. The resist mask 21 is then removed.

Next, as shown in FIG. 9, the upper gap layer 4 is formed through sputtering, for example, on the pinned layer 13 and the insulating layer 7. Finally, the upper shield layer 5 is formed through plating, for example, on the upper gap layer 4. The thin-film magnetic head is thus completed. In the structure shown in FIG. 9, the positions of the free layer 11 and the pinned layer 13 may be reversed.

The following are descriptions of features of the method of manufacturing the TMR element and the method of manufacturing the thin-film magnetic head of this embodiment. Each of these methods of this embodiment includes the step of cooling the substrate 10 which is performed before or at the same time as the step of forming the tunnel barrier layer 12 on the free layer 11. According to the embodiment, the step of forming the tunnel barrier layer 12 on the free layer 11 includes the steps of: forming a layer of nonmagnetic metal material, which is a material used for making the tunnel barrier layer 12, through sputtering, for example, on the free layer 11 while the substrate 10 is cooled; and oxidizing the layer of nonmagnetic metal material to form the tunnel barrier layer 12. The nonmagnetic metal material may be aluminum (Al).

According to this embodiment, it is preferred that the substrate 10 is cooled only in the step of forming the tunnel barrier layer 12 among the steps of forming the first magnetic layer (the free layer 11, for example), forming the tunnel barrier layer 12, and forming the second magnetic layer (the pinned layer 13, for example).

According to the embodiment, it is preferred that the step of forming the first magnetic layer includes flattening of a surface to be the base of the tunnel barrier layer 12.

According to the embodiment, it is preferred that, in the step of forming the layer of the material used for making the tunnel barrier layer 12 on the first magnetic layer, the rate at which the layer is formed is preferably lower than the rate at which the other layers are formed.

Figure 15:
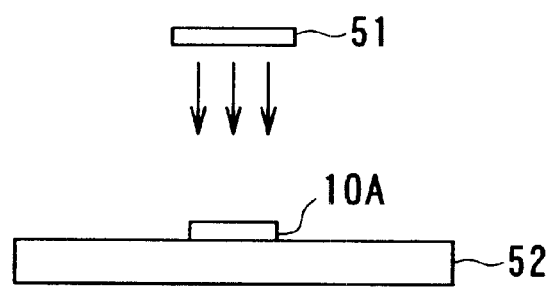
FIG. 15 is an explanatory view for illustrating an example of a method of forming a layer of a material used for making the tunnel barrier layer on the first magnetic layer while the substrate is cooled in the first embodiment of the invention.

Reference is now made to FIG. 15 to describe an example of forming the layer of the material used for making the tunnel barrier layer 12 on the first magnetic layer (the free layer 11, for example) while the substrate 10 is cooled. In the following description, the substrate 10 and the layers formed on the substrate 10 are altogether called a substrate 10A. In the example shown in FIG. 15, the substrate 10A is placed in a vacuum chamber of a sputtering apparatus such that the first magnetic layer faces toward a target 51 made of a nonmagnetic metal material and used for making the tunnel barrier layer 12. In the example shown in FIG. 15, a heat exchanger plate 52 is provided in the vacuum chamber so as to touch the bottom surface of the substrate 10A, that is, the surface of the substrate 10A on which the layers are not formed. The heat exchanger plate 52 has channels through which a fluid for cooling passes. The plate 52 keeps the substrate 10A touching the plate 52 at a specific temperature by means of the fluid for cooling flowing through the channels. Such a configuration allows the layer of nonmagnetic metal material to be formed through sputtering on the first magnetic layer while the substrate 10A is being cooled by the plate 52 or the substrate 10 is cooled by the plate 52 in advance.

The following are descriptions of the results of two experiments performed to determine the relationship between the temperature of the substrate 10 measured when a layer of Al, which was a nonmagnetic metal material, was formed on the first magnetic layer, and the critical thickness of the Al layer, that is, the minimum thickness of the Al layer that had a continuous structure.

Reference is now made to FIG. 16 to FIG. 18 to describe the first experiment performed under the following conditions. Elements having the following structure were used for this experiment. Each of the elements had a lower electrode layer made up of three layers of a Ta layer having a thickness of 5 nm, a Cu layer having a thickness of 50 nm, and a Ta layer having a thickness of 5 nm. On the lower electrode layer, the following layers were stacked one by one: a free layer made up of two layers of a NiFe layer having a thickness of 3 nm and a CoFe layer having a thickness of 3 nm; a tunnel barrier layer; a pinned layer made up of two layers of a CoFe layer having a thickness of 3 nm and a PtMn layer having a thickness of 17 nm; and an upper electrode layer made up of two layers of a Cu layer having a thickness of 50 nm and a Ta layer having a thickness of 5 nm. The tunnel barrier layer was formed by making an Al layer having a specific thickness and performing natural oxidation of the Al layer in an oxygen atmosphere at 200 Torr (26664.4 Pa) for one hour. The rate at which the Al layer was formed was 0.03 nm per second. The size of the TMR element made up of the free layer, the tunnel barrier layer and the pinned layer was 1 µm by 1 µm. Immediately before the Al layer was formed, the center line average roughness Ra of the CoFe layer, which was the base layer of the Al layer, was 0.23 nm. The center line average roughness Ra indicates the flatness of the surface of the CoFe layer.

FIG. 16 shows the result of the experiment performed to determine the relationship among the tunnel barrier layer thickness, the resistance of the TMR element, and the maximum rate of change in the resistance of the TMR element (simply shown as resistance change rate in the table) when the Al layer was formed in a vacuum chamber at a temperature of about 24° C. under the above-described conditions without controlling the temperature of the substrate 10. It is estimated that the temperature of the substrate 10 was approximately 40 to 50° C., due to the energy exerted during sputtering, when no control was performed on the temperature of the substrate 10.

According to the experiment result shown in FIG. 16, when the thickness of the tunnel barrier layer (Al layer) was 0.6 nm or smaller, the maximum rate of change in resistance was extremely low and the characteristics of the TMR element were extremely reduced. The critical thickness was 0.7 nm, according to this experiment result.

FIG. 17 shows the result of the experiment performed to determine the relationship among the tunnel barrier layer thickness, the resistance of the TMR element, and the maximum rate of change in the resistance of the TMR element, when the Al layer was formed under the above-described conditions while the temperature of the substrate 10 was maintained at 24° C. by passing cooling water at about 24° C. through the heat exchanger plate 52. According to the experiment result shown in FIG. 17, the resistance of the TMR element was lower and the maximum rate of change in resistance was greater, compared to the result shown in FIG. 16, and the characteristics of the TMR element were improved. However, the critical thickness was 0.6 nm, according to the experiment result shown in FIG. 17.

FIG. 18 shows the result of the experiment performed to determine the relationship among the tunnel barrier layer thickness, the resistance of the TMR element, and the maximum rate of change in the resistance of the TMR element, when the Al layer was formed under the above-described conditions while the temperature of the substrate 10 was maintained at −196° C. (77 K) by passing liquid nitrogen at about −196° C. through the heat exchanger plate 52. According to the experiment result shown in FIG. 18, the resistance of the TMR element was lower and the maximum rate of change in resistance was greater, compared to the result shown in FIG. 16, and the characteristics of the TMR element were improved. The critical thickness was 0.5 nm, according to the experiment result shown in FIG. 18.

Reference is now made to FIG. 19 to FIG. 21 to describe the second experiment. According to the second experiment, immediately before the Al layer was formed, the center line average roughness Ra of the surface of the CoFe layer, which was the base layer of the Al layer, was 1.65 nm. The remainder of conditions were similar to those of the first experiment.

FIG. 19 shows the result of the experiment performed to determine the relationship among the tunnel barrier layer thickness, the resistance of the TMR element, and the maximum rate of change in the resistance of the TMR element, when the Al layer was formed in the vacuum chamber at a temperature of about 24° C. under the above-described conditions without controlling the temperature of the substrate 10. It is estimated that the temperature of the substrate 10 was approximately 40 to 50° C., due to the energy exerted during sputtering, when no control was performed on the temperature of the substrate 10.

According to the experiment result shown in FIG. 19, when the thickness of the tunnel barrier layer (Al layer) was 0.8 nm or smaller, the maximum rate of change in resistance was extremely low and the characteristics of the TMR element were extremely reduced. The critical thickness was 0.9 nm, according to this experiment result.

FIG. 20 shows the result of the experiment performed to determine the relationship among the tunnel barrier layer thickness, the resistance of the TMR element, and the maximum rate of change in the resistance of the TMR element, when the Al layer was formed under the above-described conditions while the temperature of the substrate 10 was maintained at 24° C. by passing cooling water at about 24° C. through the heat exchanger plate 52. According to the experiment result shown in FIG. 20, the resistance of the TMR element was lower and the maximum rate of change in resistance was greater, compared to the result shown in FIG. 19, and the characteristics of the TMR element were improved. The critical thickness was 0.8 nm, according to the experiment result shown in FIG. 20.

FIG. 21 shows the result of the experiment performed to determine the relationship among the tunnel barrier layer thickness, the resistance of the TMR element, and the maximum rate of change in the resistance of the TMR element, when the Al layer was formed under the above-described conditions while the temperature of the substrate 10 was maintained at −196° C. (77 K) by passing liquid nitrogen at about −196° C. through the heat exchanger plate 52. According to the experiment result shown in FIG. 21, the maximum rate of change in resistance was greater, compared to the result shown in FIG. 19, and the characteristics of the TMR element were improved. The critical thickness was 0.6 nm, according to the experiment result shown in FIG. 21.

According to the above-described first and second experiment results, it is noted that the critical thickness was reduced by cooling the substrate 10 when the layer of nonmagnetic metal material used for making the tunnel barrier layer 12 was formed on the free layer 11. It is preferred that the substrate 10 is cooled such that the temperature thereof falls within −196 to 24° C. inclusive, which is easily achieved.

According to the first and second experiment results, it is noted that the critical thickness was smaller when the surface of the layer to be the base of the tunnel barrier layer 12 had greater flatness. Therefore, according to this embodiment, it is preferred to perform flattening of the layer to be the base of the tunnel barrier layer 12.

The following is a description of the gas cluster ion beam method which is an example of the method of flattening of the layer to be the base of the tunnel barrier layer 12. The gas cluster ion beam method is to blow a pressurized gas of about 1 to 5 kg into a chamber under a pressure reduced to about $10^{-4}$ to $10^{-1}$ Torr ($133.322\times10^{-4}$ to $133.322\times10^{-1}$ Pa). Gas clusters of 103 to 106 generated by adiabatic expansion are thereby ionized. These ions are accelerated at a specific voltage by an accelerating electrode. A specific numbers of gas clusters (a dose of $10^5$ to $10^8$) are thereby introduced to the top of the substrate on which processing is to be performed. According to the gas cluster ion beam method, only projecting portions of the substrate are removed by collisions between the clusters and uneven portions of the substrate. Flattening of the substrate is thus performed.

The gas used for the gas cluster ion beam method may be any of argon, xenon, krypton, neon, hydrogen, helium, and a mixture of these. In terms of economy, the most preferred of these are argon, krypton and xenon.

Among the conditions for performing the gas cluster ion beam method, the accelerating voltage, which acts as driving force having clusters collide with the surface to be flattened, is preferably 10 to 20 keV, or more preferably 12 to 18 keV. The total amount of radiation (dose) of clusters is preferably $10^{15}$ to $10^{17}$ or more preferably $10^{15}$ to $10^{16}$.

Figure 22:
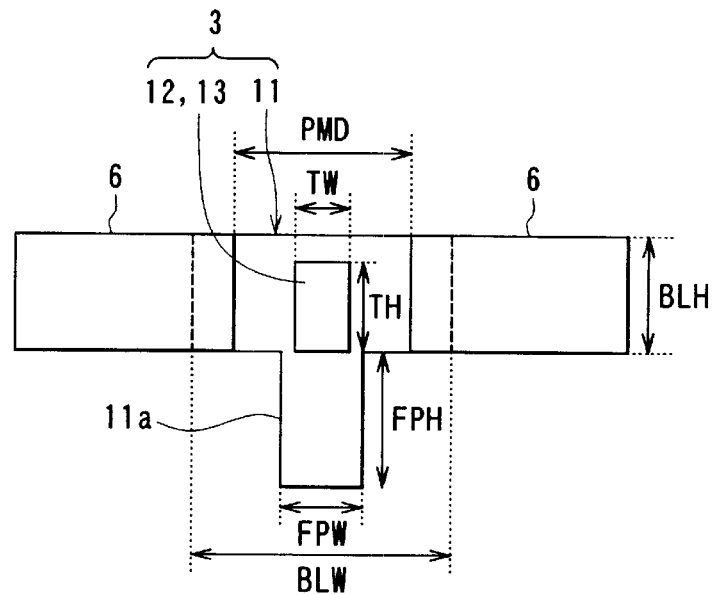
FIG. 22 is a top view of the main part of a prototype head.
Figure 23:
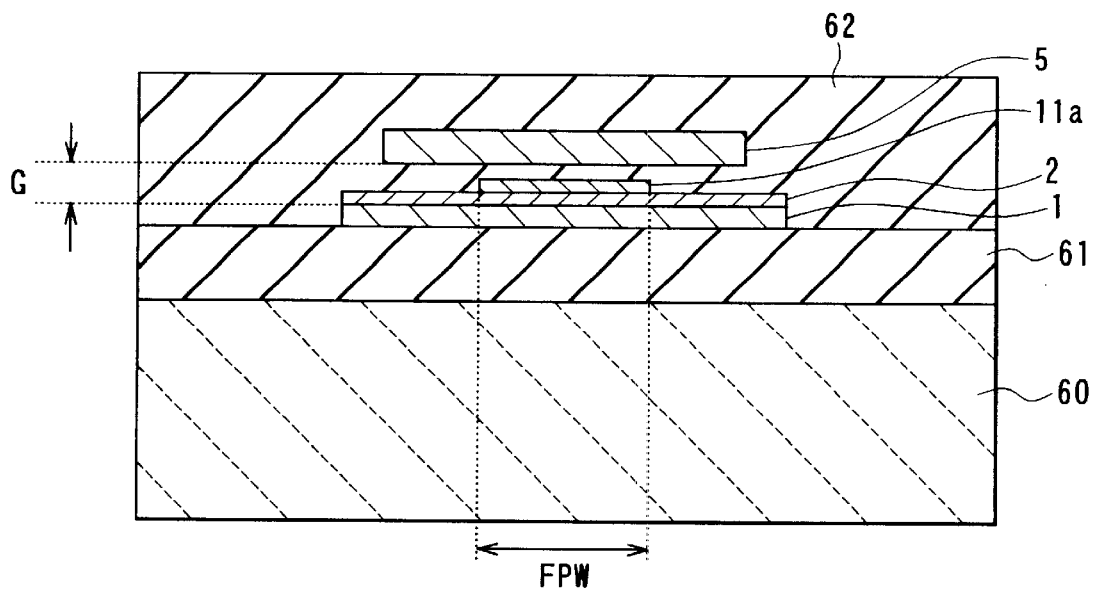
FIG. 23 is a cross section of the prototype head parallel to a surface that faces toward a medium.

Reference is now made to FIG. 22 to FIG. 24 to describe the result of experiment performed to determine the relationship between the conditions and so on for making the tunnel barrier layer 12 and the characteristics of the TMR element. In this experiment a prototype head having a configuration shown in FIG. 22 and FIG. 23 was used. FIG. 22 is a top view of the main part of the head. FIG. 23 is a cross section of the head parallel to the medium facing surface that faces toward a medium. The head comprises: a substrate 60 made of aluminum oxide and titanium carbide ($Al_2O_3$-TiC); an insulating layer 61 made of $Al_2O_3$ and formed on the substrate 60; the lower shield layer 1 formed on the insulating layer 61; the lower gap layer 2 formed on the lower shield layer 1; the TMR element 3 formed on the lower gap layer 2; the upper shield layer 5 formed on the TMR element 3; a pair of hard magnet layers 6 placed on sides of the TMR element 3 on the lower gap layer 2; and an insulating layer 62 covering the layers formed on the insulating layer 61.

The TMR element 3 includes: the free layer 11 formed on the lower gap layer 2; the tunnel barrier layer 12 formed on the free layer 11; and the pinned layer 13 formed on the tunnel barrier layer 12.

In this prototype head the tunnel barrier layer 12 and the pinned layer 13 extend over an area smaller than the area of the free layer 11. The tunnel barrier layer 12 and the pinned layer 13 are located at a distance from the medium facing surface while only the free layer 11 extends to the medium facing surface. The portion of the free layer 11 is hereinafter called a front probe 11a, the portion extending from the level at which the tunnel barrier layer 12 and the pinned layer 13 are located to the medium facing surface.

In the prototype head the free layer 11 has width BLW of 4 μm. The portion of the free layer 11 excluding the front probe 11a has length BLH of 1.5 μm which is orthogonal to the medium facing surface. The portion of the TMR element 3, in which the free layer 11, the tunnel barrier layer 12 and the pinned layer 13 are placed on top of one another, has width TW of 1 μm. This portion has length TH of 1 μm which is orthogonal to the medium facing surface. The track width, that is, width FPW of the front probe 11a is 1.2 μm. The front probe 11a has length FPH of 0.15 μm which is orthogonal to the medium facing surface. Distance PMD between the pair of hard magnet layers 6 is 1.7 μm. The read gap width, that is, gap G between the lower shield layer 1 and the upper shield layer 5 is 0.2 μm. The lower shield layer 1 is a plating layer of NiFe having a thickness of 2 μm. The upper shield layer 5 is a plating layer of NiFe having a thickness of 3.5 μm.

In the prototype head the free layer 11 of the TMR element 3 is made up of two layers of an NiFe layer having a thickness of 3 nm and a CoFe layer having a thickness of 3 nm. The pinned layer 13 is made up of two layers of a CoFe layer having a thickness of 3 nm and a PtMn layer having a thickness of 17 nm.

FIG. 24 shows the result of experiment performed to determine the relationship between the conditions and so on for making the tunnel barrier layer 12 and the characteristics of the TMR element. In FIG. 24 the item 'insulating layer' of the item 'substrate temperature' indicates the temperature of the substrate when an Al layer used for making the tunnel barrier layer 12 was formed. The item 'layers other than insulating layer' of the item 'substrate temperature' indicates the temperature of the substrate when the layers other than the tunnel barrier layer 12 were formed. The item 'insulating layer forming rate' indicates the rate at which the Al layer was formed through sputtering. The item 'base roughness' indicates center line average roughness Ra of the surface of the lower gap layer 2 that was the base layer of the Al layer. The item 'critical thickness' indicates the minimum thickness of the Al layer that forms a continuous structure.

FIG. 24 includes the items indicating the characteristics of the TMR element, that is, 'resistance of TMR element with critical thickness', 'resistance change rate with critical thickness', 'output' and 'noise'. The item 'output' indicates an output value of the prototype head for an application of 3 gigabits per square inch, in response to an external magnetic field of ±40 Oe (±40×(1000/4π)A/m). The sense current was determined for the prototype head such that the applied voltage was 150 mV when an external field was zero. The item 'noise' indicates the noise evaluated in a band of 110 MHz.

As shown in the experiment result of FIG. 24, it is noted that:

(1) The lower the temperature of the substrate, the smaller was the critical thickness.

(2) The lower the rate at which the Al layer was formed, the smaller was the critical thickness. In the experiment of FIG. 24, the layers other than the Al layer were formed through sputtering at a rate of 0.3 nm per second. Therefore, the critical thickness was reduced when, in the step of forming the Al layer, that is, the layer made of a material used for making the tunnel barrier layer 12, the Al layer was formed at a rate lower than the rate at which the other layers were formed in the step of forming the other layers.

(3) The smaller the roughness of the base layer of the Al layer, the smaller was the critical thickness.

(4) The output of the head was greater when the substrate was cooled only when the Al layer was formed, among formations of the Al layer and the layers other than the tunnel barrier layer 12.

A first advantage of smaller critical thickness is that it is possible to reduce the resistance of the TMR element and to reduce the noise, accordingly. A second advantage of smaller critical thickness is that the tunnel current rate increases, and the rate of change in resistance of the TMR element thereby increases. As a result, the output of the head is enhanced.

The following is a qualitative description of the reason that the head output was greater when the substrate was cooled only during the Al layer was formed. Two types of TMR elements will now be considered. Each of the elements comprises the lower magnetic layer, the tunnel barrier layer (Al layer) and the upper magnetic layer stacked in this order.

The lower magnetic layer of the first TMR element contains an antiferromagnetic substance. This lower magnetic layer is made up of two layers of a PtMn layer having a thickness of 30 nm and a CoFe layer having a thickness of 3 nm. The upper magnetic layer of the first TMR element is made up of two layers of an NiFe layer having a thickness of 3 nm and a CoFe layer having a thickness of 2 nm.

The upper magnetic layer of the second TMR element contains an antiferromagnetic substance. The lower magnetic layer thereof is made up of two layers of an NiFe layer having a thickness of 3 nm and a CoFe layer having a thickness of 2 nm. The upper magnetic layer thereof is made up of two layers of a CoFe layer having a thickness of 3 nm and a PtMn layer having a thickness of 30 nm.

With regard to the first TMR element, the substrate is assumed to be heated such that the temperature thereof reaches 100° C. when the lower magnetic layer is formed and when the upper magnetic layer is formed. In this case, the crystal grain diameter of the lower magnetic layer increases and the surface roughness increases. As a result, the critical thickness increases. The grain diameter of the upper magnetic layer increases and the surface roughness increases, too. However, such increases in the upper magnetic layer will cause no actual damage.

Next, with regard to the first TMR element, the substrate is assumed to be cooled such that the temperature thereof is made −196° C. when the lower magnetic layer is formed and when the upper magnetic layer is formed. In this case, the grain diameter of the lower magnetic layer decreases and the exchange coupling property of the two layers thereof is reduced. As a result, the outputs of the TMR element and the head decrease. In addition, the soft magnetic property of the upper magnetic layer is reduced. The outputs of the TMR element and the head thereby decrease.

Next, with regard to the second TMR element, the substrate is assumed to be heated such that the temperature thereof reaches 100° C. when the lower magnetic layer is formed and when the upper magnetic layer is formed. In this case, the grain diameter of the lower magnetic layer increases and the surface roughness increases. As a result, the critical thickness increases. The grain diameter of the upper magnetic layer increases and the surface roughness increases, too. However, such increases in the upper magnetic layer will cause no actual damage.

Next, with regard to the second TMR element, the substrate is assumed to be cooled such that the temperature thereof is made −196° C. when the lower magnetic layer is formed and when the upper magnetic layer is formed. In this case, the soft magnetic property of the lower magnetic layer decreases. As a result, the outputs of the TMR element and the head decrease. In addition, the grain diameter of the upper magnetic layer decreases and the exchange coupling property of the two layers thereof is reduced. The outputs of the TMR element and the head thereby decrease.

According to the above-described consideration, it is noted that, with regard to both first and second TMR elements, the outputs of the TMR element and the head decrease if the substrate is cooled when the lower magnetic layer is formed and when the upper magnetic layer is formed. Therefore, the outputs of the TMR element and the head are greater if the substrate is cooled only when the Al layer is formed.

According to the embodiment described so far, in the step of forming the tunnel barrier layer 12, the layer of the material used for making the tunnel barrier layer 12 is formed while the substrate is cooled. As a result, the thickness of the tunnel barrier layer 12 is reduced without reducing the characteristics.

The outputs of the TMR element and the thin-film magnetic head incorporating the TMR element are increased if the substrate is cooled only in the step of forming the tunnel barrier layer 12, among the steps of forming the first magnetic layer (lower magnetic layer), forming the tunnel barrier layer 12, and forming the second magnetic layer (upper magnetic layer).

The thickness of the tunnel barrier layer 12 is made smaller if the step of forming the first magnetic layer includes flattening of the surface of the base layer of the tunnel barrier layer 12.

The thickness of the tunnel barrier layer 12 is made smaller if, in the step of forming the layer of the material used for making the tunnel barrier layer 12, this layer is formed at a rate lower than the rate at which the other layers are formed.

As thus described, the embodiment achieves the low-resistance TMR element and thin-film magnetic head capable of producing a high output.

According to the embodiment, the deposition layers 15 are made of the material that is separated through etching and deposits on the sidewalls 14 and undergoes oxidation or nitriding. Since the deposition layers 15 have a high resistance value, it is possible to prevent formation of channels of extra currents that would not contribute to the tunnel magnetoresistive effect.

[Second Embodiment]

Figure 25:
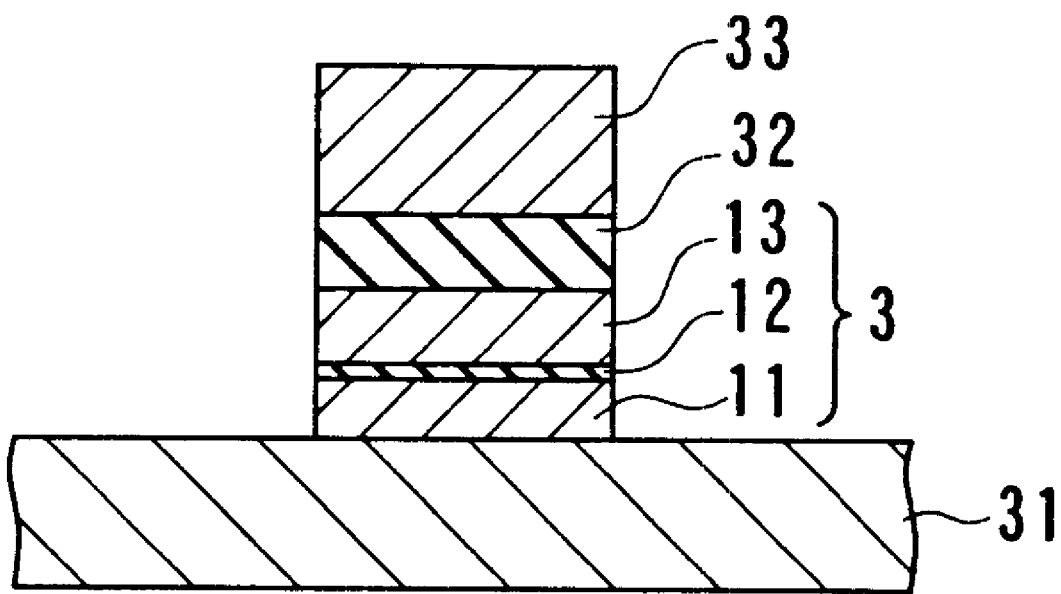
FIG. 25 is a cross section illustrating an example of the configuration of a memory element to which a second embodiment of the invention is applied.

A method of manufacturing a memory element of a second embodiment of the invention will now be described. FIG. 25 is a cross section illustrating an example of the configuration of the memory element to which this embodiment is applied. The memory element makes up each of memory cells of a nonvolatile magnetic random access memory (hereinafter called MRAM). The MRAM comprises a plurality of bit lines 31 and a plurality of word lines 33 arranged in a matrix. Each of the memory cells of the MRAM, that is, the memory element of this embodiment comprises the TMR element 3 located between one of the bit lines 31 and one of the word lines 33 at the intersection thereof.

The TMR element 3 of the embodiment includes the free layer 11, the tunnel barrier layer 12 and the pinned layer 13 stacked, as the element 3 of the first embodiment. In the second embodiment the TMR element 3 is placed such that the free layer 11 touches the bit line 31. An insulating layer 32 is provided between the pinned layer 13 and the word line 33.

The memory element of the embodiment is fabricated through stacking the bit line 31, the TMR element 3, the insulating layer 32 and the word line 33 one by one on a substrate not shown, using semiconductor manufacturing techniques. The tunnel barrier layer 12 of the TMR element 3 is formed in a manner similar to that of the first embodiment.

The function of the memory element of the embodiment will now be described. In this memory element the free layer 11 of the TMR element 3 functions as a storage layer in which data is stored. Storage of data is performed by reversing the magnetization (spin) of the free layer 11 through the use of the composite magnetic field generated by the current flowing through the bit line 31 and the current flowing through the word line 33. Reading of data is performed by determining the difference in the state of magnetization (spin) of the free layer 11 through the use of the tunnel magnetoresistive effect of the TMR element 3.

According to the embodiment, the thickness of the tunnel barrier layer 12 of the TMR element 3 is reduced without reducing the characteristics. The low-resistance TMR element 3 capable of producing high outputs is thus obtained. As a result, the high-performance memory element and MRAM are obtained.

The remainder of configuration, functions and effects of the second embodiment are similar to those of the first embodiment.

The present invention is not limited to the foregoing embodiments but may be practiced in still other ways. For example, although the thin-film magnetic head that functions as a reproducing head is disclosed in the first embodiment, the invention is applicable to a composite thin-film magnetic head made up of layers of a reproducing head utilizing the TMR element and a recording head incorporating an induction-type electromagnetic transducer for writing.

The configurations of the TMR element and the thin-film magnetic head of the first embodiment and the configurations of the TMR element and the memory element of the second embodiment are given by way of examples. Therefore, the invention may be applied to TMR elements, thin-film magnetic heads and memory elements having any other configurations.

According to the methods of manufacturing the tunnel magnetoresistive element, the thin-film magnetic head or the memory element of the invention described so far, the layer of the material used for making the tunnel barrier layer is formed on the first magnetic layer while the substrate is cooled. As a result, it is possible to reduce the thickness of the tunnel barrier layer without reducing the performance characteristics.

According to the methods of manufacturing the tunnel magnetoresistive element, the thin-film magnetic head or the memory element of the invention, the output of the tunnel magnetoresistive element is increased if the substrate is cooled only in the step of forming the tunnel barrier layer, among the steps of forming the first magnetic layer, forming the tunnel barrier layer, and forming the second magnetic layer.

According to the methods of manufacturing the tunnel magnetoresistive element, the thin-film magnetic head or the memory element of the invention, the thickness of the tunnel barrier layer is made smaller if the step of forming the first magnetic layer includes flattening of the surface of the base layer of the tunnel barrier layer.

According to the methods of manufacturing the tunnel magnetoresistive element, the thin-film magnetic head or the memory element of the invention, the thickness of the tunnel barrier layer is made smaller if, in the step of forming the layer of the material used for making the tunnel barrier layer, this layer is formed at a rate lower than the rate at which the other layers are formed.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a tunnel magnetoresistive element comprising a tunnel barrier layer and first and second magnetic layers sandwiching the tunnel barrier layer, the method including the steps of:

forming the first magnetic layer on a substrate;

forming the tunnel barrier layer on the first magnetic layer; and forming the second magnetic layer on the tunnel barrier layer; wherein the step of forming the tunnel barrier layer includes steps of:

cooling the substrate;

and forming a layer of material used for making the tunnel barrier layer on the first magnetic layer while the substrate remains cooled, and the substrate is cooled only in the step of forming the tunnel barrier layer, among the steps of forming the first magnetic layer, forming the tunnel barrier layer, and forming the second magnetic layer.

2. The method according to claim 1 wherein the step of forming the tunnel barrier layer includes the steps of: forming a layer of a nonmagnetic metal material, which is the material used for making the tunnel barrier layer, on the first magnetic layer while the substrate remains cooled; and oxidizing the layer of the nonmagnetic metal material to form the tunnel barrier layer.

3. The method according to claim 1 wherein the step of forming the first magnetic layer includes flattening of a surface to be a base of the tunnel barrier layer.

4. The method according to claim 1 wherein, in the step of forming the layer of the material used for making the tunnel barrier layer, this layer is formed at a growth rate lower than a growth rate at which the other layers are formed in the steps of forming the other layers.

5. A method of manufacturing a thin-film magnetic head incorporating a tunnel magnetoresistive element comprising a tunnel barrier layer and first and second magnetic layers sandwiching the tunnel barrier layer, the method including the steps of:

forming the first magnetic layer on a substrate:

forming the tunnel barrier layer on the first magnetic layer; and forming the second magnetic layer on the tunnel barrier; wherein the step of forming the tunnel barrier layer includes steps of:

cooling the substrate;

and forming a layer of a material used for making the tunnel barrier layer on the first magnetic layer while the substrate remains cooled, and the substrate is cooled only in the step of forming the tunnel barrier layer, among the steps of forming the first magnetic layer, forming the tunnel barrier layer, and forming the second magnetic layer.

6. The method according to claim 5 wherein the step of forming the tunnel barrier layer includes the steps of: forming a layer of nonmagnetic metal material, which is the material used for making the tunnel barrier layer, on the first magnetic layer while the substrate remains cooled; and oxidizing the layer of the nonmagnetic metal material to form the tunnel barrier layer.

7. The method according to claim 5 wherein the step of forming the first magnetic layer includes flattening of a surface to be a base of the tunnel barrier layer.

8. The method according to claim 6 wherein, in the step of forming the layer of the material used for making the tunnel barrier layer, this layer is formed at a growth rate lower than a growth rate at which the other layers are formed in the steps of forming the other layers.

9. A method of manufacturing a memory element incorporating a tunnel magnetoresistive element comprising a tunnel barrier layer and first and second magnetic layers sandwiching the tunnel barrier layer, the method including the steps of:

forming the first magnetic layer on a substrate;

forming the tunnel barrier layer on the first magnetic layer; and forming the second magnetic layer on the tunnel barrier layer; wherein the step of forming the tunnel barrier layer includes the steps of:

cooling the substrate;

and forming a layer of a material used for making the tunnel barrier layer on the first magnetic layer while the substrate remains cooled, and the substrate is cooled only in the step of forming the tunnel barrier layer, among the steps of forming the first magnetic layer, forming the tunnel barrier layer, and forming the second magnetic layer.

10. The method according to claim 9 wherein the step of forming the tunnel barrier layer includes the steps of: forming a layer of a nonmagnetic metal material, which is the material used for making the tunnel barrier layer, on the first magnetic layer while the substrate remains cooled; and oxidizing the layer of the nonmagnetic metal material to form the tunnel barrier layer.

11. The method according to claim 9 wherein the step of forming the first magnetic layer includes flattening of a surface to be a base of the tunnel barrier layer.

12. The method according to claim 9 wherein, in the step of forming the layer of the material used for making the tunnel barrier layer, this layer is formed at a growth rate lower than a growth rate at which the other layers are formed in the steps of forming the other layers.

* * * * *